(12) United States Patent
Jo et al.

(10) Patent No.: US 8,022,618 B2
(45) Date of Patent: Sep. 20, 2011

(54) STRUCTURE OF ORGANIC LIGHT EMITTING DISPLAY APPARATUS

(75) Inventors: Gyoo-Chul Jo, Suwon-si (KR); Kwang-Nam Kim, Suwon-si (KR)

(73) Assignee: Samsung Mobile Display Co., Ltd., Yongin (KR)

(*) Notice: Subject to any disclaimer, the term of this patent is extended or adjusted under 35 U.S.C. 154(b) by 297 days.

(21) Appl. No.: 12/200,791

(22) Filed: Aug. 28, 2008

(65) Prior Publication Data

US 2009/0058280 A1 Mar. 5, 2009

(30) Foreign Application Priority Data

Sep. 3, 2007 (KR) .................. 10-2007-0089067

(51) Int. Cl.
*H01L 51/00* (2006.01)
(52) U.S. Cl. ........................ 313/504; 313/506
(58) Field of Classification Search .............. 313/504, 313/506; 257/40, 79
See application file for complete search history.

(56) References Cited

U.S. PATENT DOCUMENTS

| | | | |
|---|---|---|---|
| 2003/0146693 A1 | 8/2003 | Ishihara et al. | |
| 2003/0151358 A1 | 8/2003 | Iga | |
| 2004/0256620 A1 | 12/2004 | Yamazaki et al. | |
| 2005/0057148 A1* | 3/2005 | Seki et al. | 313/504 |
| 2005/0110023 A1 | 5/2005 | Lee et al. | |
| 2006/0043360 A1* | 3/2006 | Kim et al. | 257/40 |
| 2006/0060850 A1 | 3/2006 | Kwak et al. | |
| 2006/0113900 A1 | 6/2006 | Oh | |
| 2007/0021025 A1 | 1/2007 | Kim et al. | |

FOREIGN PATENT DOCUMENTS

| | | |
|---|---|---|
| CN | 1735290 A | 2/2006 |
| CN | 1744771 A | 3/2006 |
| CN | 1812119 A | 8/2006 |
| EP | 1 701 387 A2 | 9/2006 |
| JP | 2003-233332 | 8/2003 |
| JP | 2003-303687 | 10/2003 |
| JP | 2005-031651 | 2/2005 |
| JP | 2005-338789 | 12/2005 |
| JP | 2006-072296 | 3/2006 |
| JP | 2006-156374 | 6/2006 |
| JP | 2006-171745 | 6/2006 |
| JP | 2006-253674 | 9/2006 |

(Continued)

OTHER PUBLICATIONS

European Search Report dated May 26, 2009 for the corresponding European Application No. 08252906.6 listing cited references in this IDS.

(Continued)

*Primary Examiner* — Karabi Guharay
(74) *Attorney, Agent, or Firm* — Christie, Parker & Hale, LLP

(57) ABSTRACT

An organic light emitting display apparatus including: a substrate having a display area; a thin film transistor (TFT) disposed in the display area of the substrate; an electrode power supply line disposed outside the display area of the substrate; a first insulating layer covering the TFT and having a first open portion through which a portion or a whole top surface of the electrode power supply line is exposed; and a second insulating layer disposed on the first insulating layer and having a second open portion through which the first open portion of the first insulating layer is exposed, so that the second insulating layer does not contact the electrode power supply line.

22 Claims, 11 Drawing Sheets

FOREIGN PATENT DOCUMENTS

| KR | 10-0572657 B1 | 4/2006 |
|---|---|---|
| KR | 10-2006-0040427 A | 5/2006 |
| KR | 10-2006-0104531 A | 10/2006 |
| KR | 10-0702586 B1 | 4/2007 |

OTHER PUBLICATIONS

European Search Report dated Dec. 3, 2008, for corresponding European application 08252906.6, indicating relevance of listed references in this IDS.

Registration Determination Certificate dated Nov. 27, 2008 for Priority Korean application No. 10-2007-0089067 indicating relevance of cited references.

Japanese Office action dated Jul. 6, 2010, for corresponding Japanese Patent application 2008-222437, noting listed references in this IDS.

U.S. counterparts of JP 2003-233332 listed above: U.S. Patent 7,301,275 continuation of 6,836,069,(U.S. Publication 2003/0151358, previously filed in an IDS dated Jul. 17, 2009).

U.S. counterparts of JP 2003-303687 listed above: U.S. Patent 7,408,197 continuation of 6,864,638, (U.S. Publication 2003/0146693 previously filed in an IDS dated Feb. 26, 2009), and U.S. Publication 2008/0299861 divisional of 7,408,197.

U.S. counterparts of JP 2005-031651 listed above: U.S. Patent 7,411,344 continuation of 7,224,118, and U.S. Publication 2008/0164474 divisional of 7,411,344.

U.S. counterpart of JP 2005-338789 listed above: U.S. Publication 2006/0060850 (7,279,708) previously filed in an IDS dated Feb. 26, 2009.

U.S. counterparts of JP 2006-072296 listed above: U.S. Publication 2007/0021025 (7,625,259) previously filed in an IDS dated Jul. 17, 2009, divisional of U.S. Patent 7,187,001.

U.S. counterparts of JP 2006-156374 listed above: U.S. Publication 2006/0113900 (7,701,132) previously filed in an IDS dated Jul. 17, 2009.

SIPO Office action dated May 25, 2011, for corresponding Chinese Patent application 200810214654.9, noting listed references in this IDS.

* cited by examiner

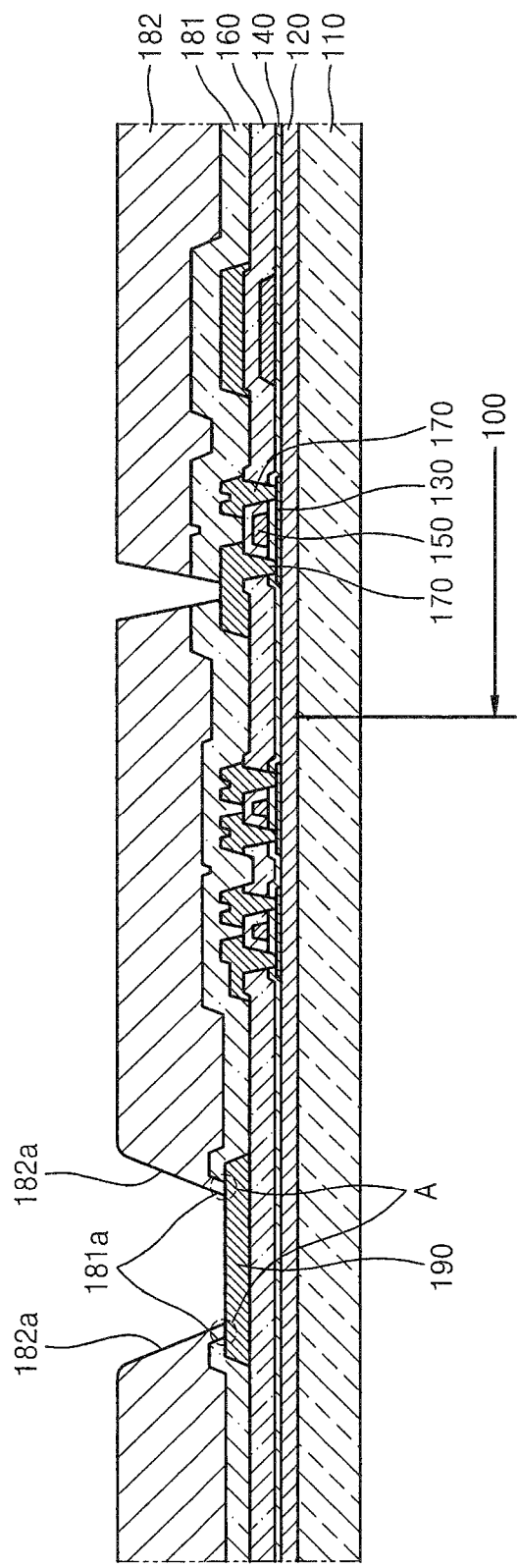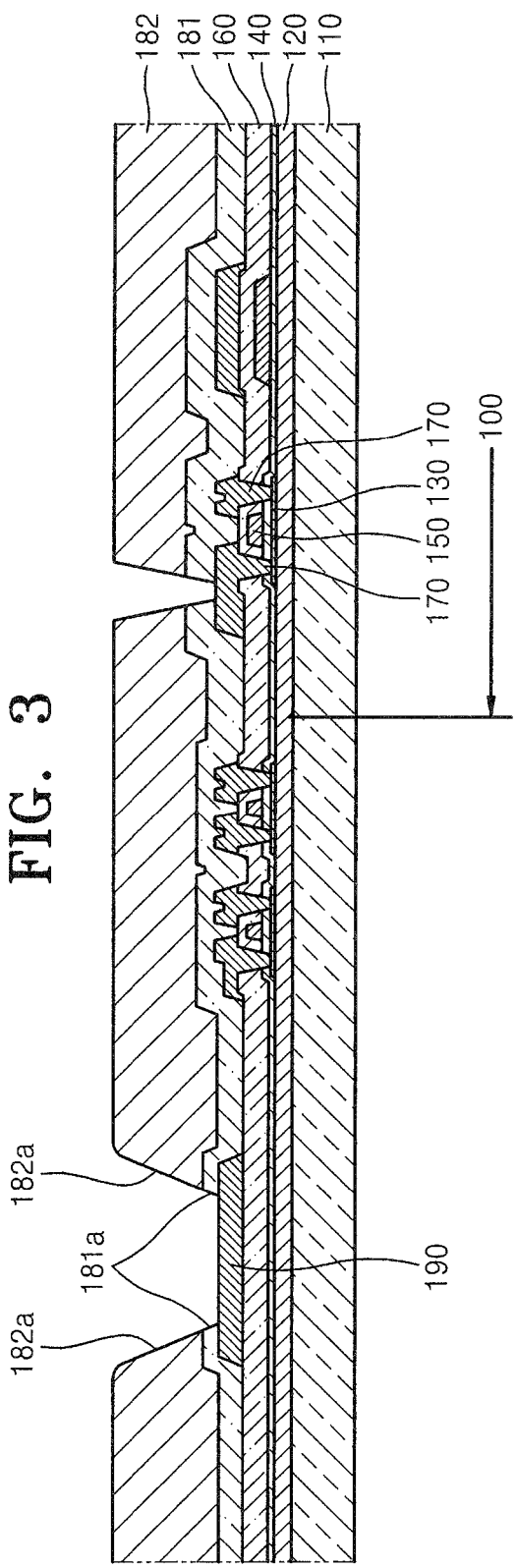

STRUCTURE OF ORGANIC LIGHT EMITTING DISPLAY APPARATUS

CROSS-REFERENCE TO RELATED PATENT APPLICATION

This application claims priority to and the benefit of Korean Patent Application No. 10-2007-0089067, filed on Sep. 3, 2007, in the Korean Intellectual Property Office, the entire content of which is incorporated herein by reference.

BACKGROUND OF THE INVENTION

1. Field of the Invention

The present invention relates to an organic light emitting display apparatus.

2. Description of the Related Art

An organic light emitting display apparatus refers to a display apparatus that includes light emitting devices in its display area. A light emitting device includes a pixel electrode, a counter electrode, and an intermediate layer interposed between the pixel electrode and the counter electrode, the intermediate layer including a light emitting layer.

An organic light emitting display apparatus can be categorized as either an active matrix display or a passive matrix display according to how the organic light emitting devices of the organic light emitting display apparatus are driven. In the active matrix display, whether each sub-pixel emits light is controlled through a thin film transistor (TFT). In the passive matrix display, whether each sub-pixel emits light is controlled through electrodes arranged in a matrix form. In the case of the active matrix display, counter electrodes of a plurality of sub-pixels are generally formed as one body and contact an electrode power supply line positioned outside a display area.

The electrode power supply line is typically formed of a material that is low in resistance and high in conductance. However, a material this is low in resistance and high in conductance can adversely react with an organic material. Thus, in a conventional organic light emitting display apparatus, an electrode power supply line may contact a layer of the display apparatus formed of an organic material and thus be damaged. If the electrode power supply line is damaged, an electrical signal supplied to a counter electrode of the display apparatus through the electrode power supply line is distorted. Thus, an accurate image is not represented properly due to the distortion. In addition, a function of the electrode power supply line is deteriorated, and thus the accurate image is not represented properly.

SUMMARY OF THE INVENTION

An aspect of an embodiment of the present invention is directed toward an organic light emitting display apparatus capable of reducing (or preventing) damage to its electrode power supply line.

According to an embodiment of the present invention, there is provided an organic light emitting display apparatus including: a substrate having a display area; a thin film transistor (TFT) disposed in the display area of the substrate; an electrode power supply line disposed outside the display area of the substrate; a first insulating layer covering the TFT and having a first open portion through which a portion or a whole top surface of the electrode power supply line is exposed; and a second insulating layer disposed on the first insulating layer and having a second open portion through which the first open portion of the first insulating layer is exposed so that the second insulating layer does not contact the electrode power supply line.

The first insulating layer may be a passivation layer.

The second insulating layer may be a planar layer of which the top surface of the second insulating layer is planar although TFT is disposed under the second insulating layer.

The organic light emitting display apparatus may further include: a pixel electrode disposed in the display area of the substrate and on the second insulating layer so that the pixel electrode is electrically connected to the TFT; and a third insulating layer disposed on the second insulating layer, having a third open portion through which the first open portion of the first insulating layer is exposed so that the third insulating layer does not contact the electrode power supply line, and through which a portion or a whole top surface of the pixel electrode is exposed.

The first insulating layer may include a plurality of first open portion, wherein the organic light emitting display apparatus further includes: a pixel electrode disposed in the display area of the substrate and on the second insulating layer so that the pixel electrode is electrically connected to the TFT; a third insulating layer disposed to cover the electrode power supply line exposed through some of the first open portions of the first insulating layer, the third insulating layer having a third open portion through which a portion or a whole portion of the pixel electrode is exposed; and an auxiliary conductive layer interposed between the electrode power supply line, exposed through the some of the first open portions of the first insulating layer, and the third insulating layer, so that the third insulating layer does not contact the electrode power supply line.

The auxiliary conductive layer may be formed of the same material as that of which the pixel electrode is formed.

The organic light emitting display apparatus may further include: a pixel electrode disposed in the display area of the substrate and on the second insulating layer so that the pixel electrode is electrically connected to the TFT; a third insulating layer disposed to cover the electrode power supply line exposed through the first insulating layer, the third insulating layer having a third open portion through which a portion or a whole portion of the pixel electrode is exposed; and an auxiliary conductive layer interposed between the electrode power supply line, exposed through the first insulating layer, and the third insulating layer, so that the third insulating layer does not contact the electrode power supply line.

The auxiliary conductive layer may be formed of the same material as that of which the pixel electrode is formed.

The second insulating layer may be formed of an organic material.

The second insulating layer may be formed of acryl, benzocyclobutene (BCB), and/or photoacryl.

The third insulating layer may be formed of an organic material.

The third insulating layer may be formed of polyimide.

The organic light emitting display apparatus may further include a pixel electrode disposed in the display area of the substrate and on the first insulating layer, so that the pixel electrode is electrically connected to the TFT, wherein the second insulating layer is a pixel defining layer through which a portion or a top surface of the pixel electrode is exposed.

The second insulating layer may be formed of an organic material.

The second insulating layer may be formed of polyimide.

According to another embodiment of the present invention, there is provided an organic light emitting display apparatus including: a substrate having a display area; a TFT disposed in the display area of the substrate; an electrode power supply line disposed outside the display area of the substrate; a first insulating layer covering the TFT and having a plurality of first open portions through which a portion or a whole top surface of the electrode power supply line is exposed; a pixel electrode disposed in the display area of the substrate and on the first insulating layer so that the pixel electrode is electrically connected to the TFT; a second insulating layer disposed to cover the electrode power supply line exposed through one or more of the first open portions of the first insulating layer, and the second insulating layer having a second open portion through which a portion or a top surface of the pixel electrode is exposed; and an auxiliary conductive layer interposed between the electrode power supply line, exposed through the one or more of the first open portions of the first insulating layer, and the second insulating layer, so that the second insulating layer does not contact the electrode power supply line.

According to another aspect of the present invention, there is provided an organic light emitting display apparatus including: a substrate having a display area; a TFT disposed in the display area of the substrate; an electrode power supply line disposed outside the display area of the substrate; a first insulating layer covering the TFT and having a first open portion through which a portion or a whole top surface of the electrode power supply line is exposed; a pixel electrode disposed in the display area of the substrate and on the first insulating layer so that the pixel electrode is electrically connected to the TFT; a third insulating layer disposed to cover the electrode power supply line exposed through the first insulating layer, the third insulating layer having a third open portion through which a portion or a top surface of the pixel electrode is exposed; and an auxiliary conductive layer interposed between the electrode power supply line, exposed through the first insulating layer, and the third insulating layer, so that the third insulating layer does not contact the electrode power supply line.

The auxiliary conductive layer may be formed of the same material as that of which the pixel electrode is formed.

The first insulating layer may be formed of an inorganic material.

The first insulating layer may be formed of silicon nitride, silicon oxide, and/or silicon oxynitride.

The electrode power supply line may be formed of a material that substantially reacts with an organic material.

The electrode power supply line may be formed of copper, silver, and/or aluminum.

The TFT may include source, drain, and gate electrodes, and the electrode power supply line may be formed of the same material as that of which at least one of the source, drain, and gate electrodes is formed, on the same layer on which the at least one of the source, drain, and gate electrode is formed.

The organic light emitting display apparatus may further include a counter electrode contacting the electrode power supply line and disposed above the display area of the substrate.

BRIEF DESCRIPTION OF THE DRAWINGS

The accompanying drawings, together with the specification, illustrate exemplary embodiments of the present invention, and, together with the description, serve to explain the principles of the present invention.

FIG. 2 is a schematic cross-sectional view of a portion of an organic light emitting display apparatus according to a comparative example;

FIG. 3 is a schematic cross-sectional view of a portion of an organic light emitting display apparatus according to another embodiment of the present invention;

DETAILED DESCRIPTION

Figure 1:
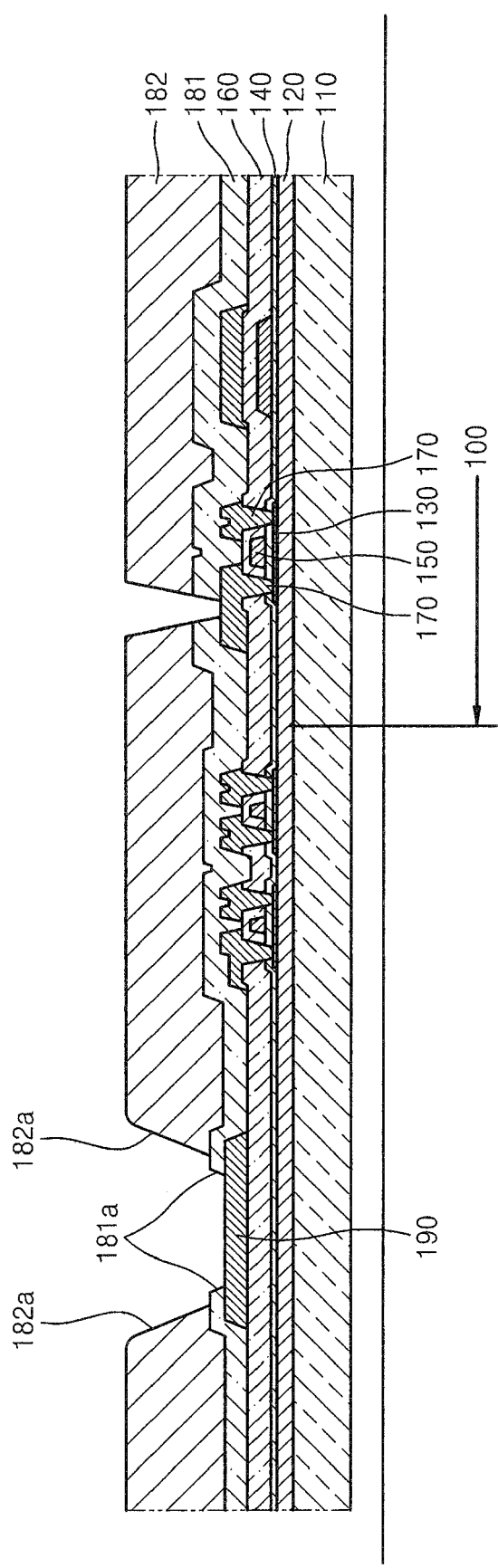
FIG. 1 is a schematic cross-sectional view of a portion of an organic light emitting display apparatus according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

FIG. 1 is a schematic cross-sectional view of a portion of an organic light emitting display apparatus according to an embodiment of the present invention. Referring to FIG. 1, the organic light emitting display apparatus includes a substrate 110 having a display area 100. The substrate 110 may be formed of various suitable materials, such as a glass material, a metallic material, a plastic material, etc. A first thin film transistor (TFT) is disposed in the display area 100 of the substrate 110. Besides the first TFT, an organic light emitting device may be disposed in the display area 100. An electrode power supply line 190 is disposed outside the display area 100 of the substrate 110. A first insulating layer 181 is disposed to cover the first TFT so as to protect the first TFT. The first insulating layer 181 has a first open portion 181a through which a portion or a whole top surface of the electrode power supply line 190 is exposed. A second insulating layer 182 is disposed on the first insulating layer 181. The second insulating layer 182 has a second open portion 182a through which the first open portion 181a of the first insulating layer 181 is exposed, and the second insulating layer 182 does not contact the electrode power supply line 190.

As such, in the organic light emitting display apparatus of the present embodiment having the above-described structure, the second insulating layer 182 does not contact the electrode power supply line 190.

FIG. 2 is a schematic cross-sectional view of a portion of an organic light emitting display apparatus according to a comparative example. In the case of the organic light emitting display apparatus of FIG. 2, portion A of a second insulating layer 182 contacts an electrode power supply line 190.

The electrode power supply line 190 may be simultaneously (or currently) formed when source and/or drain electrodes 170 and/or a gate electrode 150 of a first TFT is formed. For example, in FIGS. 1 and 2, the electrode power supply line 190 is formed when the source and/or drain electrodes 170 of the first TFT are formed and thus is disposed on an interlayer insulating layer 160. The interlayer insulting layer 160 is formed on a buffer layer 120 and a gate insulating layer 140. The electrode power supply line 190 may be formed of a material that substantially reacts with an organic material such as copper, silver, or aluminum.

The electrode power supply line 190 shown in FIG. 1 is exposed through the first insulating layer 181, but does not contact the second insulating layer 182. However, the electrode power supply line 190 of FIG. 2, exposed by the first insulating layer 181, contacts the second insulating layer 182. The first insulating layer 181 operates as a passivation layer, which protects the first TFT under the first insulating layer 181 and is formed of an inorganic material such as silicon oxide, silicon nitride, or silicon oxynitride. The second insulating layer 182 operates as a planarizing layer, which planarizes or substantially planarizes a top surface of the first insulating layer 181. This planarizing layer is utilized because the top surface of the first insulating layer 181 has undulation due to elements such as TFT disposed below the first insulating layer 181. The second insulating layer 182 is formed of an organic material, e.g., acryl, benzocyclobutene (BCB), photoacryl, or the like.

In the organic light emitting display apparatus as shown in FIG. 2, as stated before, portion A of the second insulating layer 182, formed of an organic material, contacts the electrode power supply line 190. Thus, the electrode power supply line 190 reacts with an organic component of the second insulating layer 182 and thus is damaged. As a result, IR drop may occur and/or electrical signal may not be transmitted (or not be properly transmitted) due to an increase in resistance in the electrode power supply line 190. For example, if the electrode power supply line 190 is formed of copper and the second insulating layer 182 is formed of acryl, the copper of the electrode power supply line 190 and the acryl of the second insulating layer 182 react with each other during pre-baking and curing of the second insulating layer 182. As a result of the reaction, the copper surface of the electrode power supply line 190 is degenerated. The degeneration may be a degeneration of a copper oxide layer caused by oxygen included in acryl. Thus, the IR drop may occur and/or electrical signal may not be transmitted (or be transmitted improperly) due to the increase in the resistance in the electrode power supply line 190.

In contrast, in the case of the organic light emitting display apparatus of the present embodiment shown in FIG. 1, the first insulating layer 181 has the first open portion 181a through which the portion or the whole top surface of the electrode power supply line 190 is exposed. Also, the second insulating layer 182 has the second open portion 182a through which the first open portion 181a of the first insulating layer 181, when the second insulating layer 182 is disposed on the first insulating layer 181, is exposed, so that the second insulating layer 182 does not contact the electrode power supply line 190. Thus, the organic light emitting display apparatus of the present embodiment can effectively prevent (or protect) the electrode power supply line 190 from reacting with the organic material of the second insulating layer 182, so as to not be damaged.

As shown in FIG. 1, the first open portion 181a of the first insulating layer 181 and a portion of the top surface of the first insulating layer 181 around the first open portion 181a are exposed through the second insulating layer 182. However, the present invention is not limited thereto. In other words, in an organic light emitting display apparatus of according to another embodiment of the present invention, as shown in FIG. 3, first and second insulating layers 181 and 182 may be formed. Then, openings in the first and second insulating layers 181 and 182 may be created by removing portions of the first and second insulating layers 181 and 182 so as to expose an electrode power supply line 190. As a result, a first open portion 181a of the first insulating layer 181 may coincide with a second open portion 182a of the second insulating layer 182 such that the first open portion 181a of the first insulating layer 181 is flush with the second open portion 182a of the second insulating layer 182, and thus, a portion (or surface) of the first insulating layer 181 may be exposed. In the present embodiment, the second insulating layer 182 has the second open portion 182a through which the first end open portion 181a of the first insulating layer 181 is exposed and thus does not contact the electrode power supply line 190.

Figure 4:
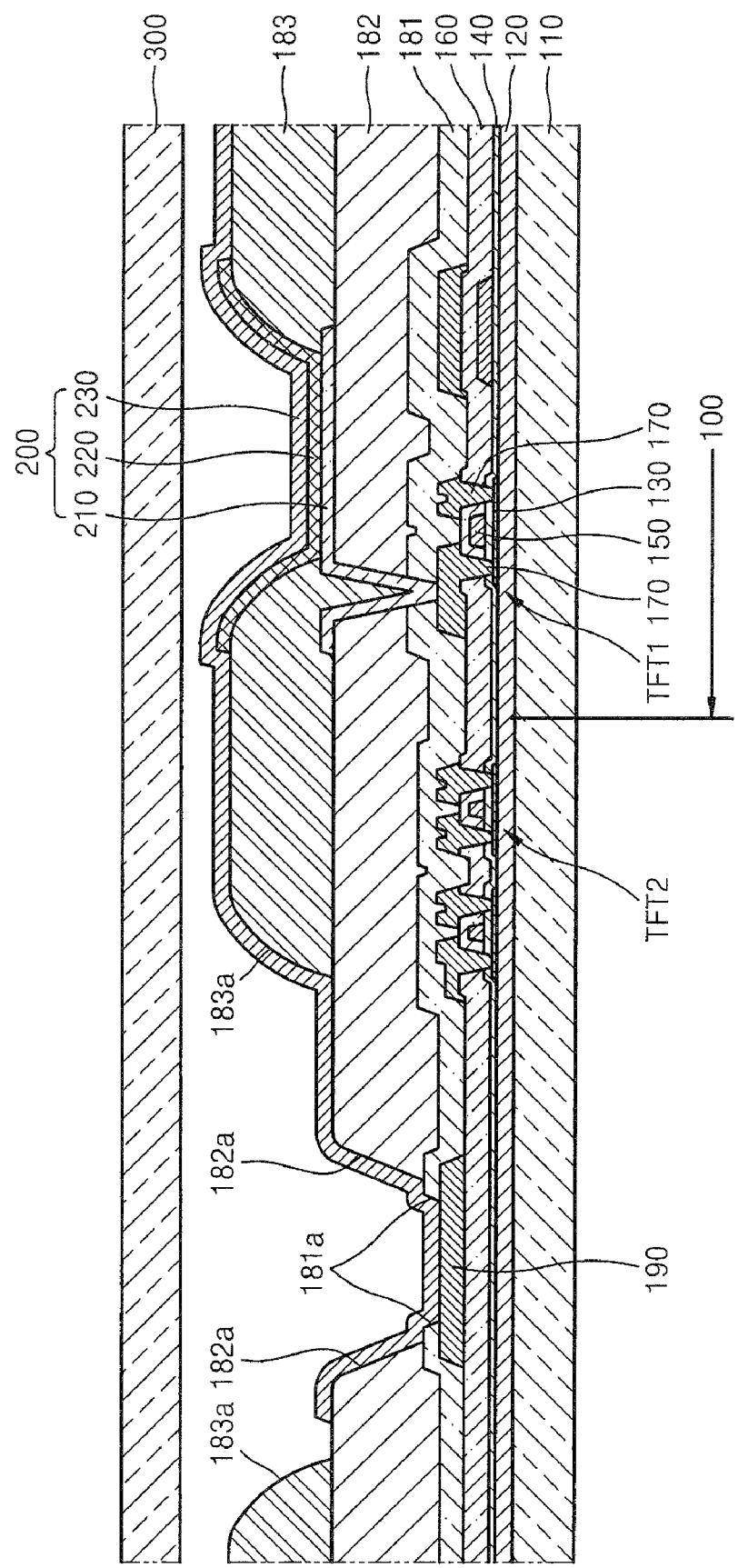
FIG. 4 is a schematic cross-sectional view of a portion of an organic light emitting display apparatus according to another embodiment of the present invention.

FIG. 4 is a schematic cross-sectional view of a portion of an organic light emitting display apparatus according to another embodiment of the present invention. Referring to FIG. 4, the organic light emitting display apparatus includes a first substrate 300 and a second substrate 110 having a display area 100. The second substrate (or the substrate) 110 may be formed of various suitable materials, such as a glass material, a metallic material, a plastic material, etc. A first TFT1 and an organic light emitting device 200 are disposed in the display area 100 of the substrate 110. An electrode power supply line 190 is disposed outside the display area 100 of the substrate 110. A first insulating layer 181 is disposed to cover the first TFT1 so as to protect the first TFT1. The first insulating layer 181 has a first open portion 181a through which a portion or a whole top surface of the electrode power supply line 190 is exposed. A second insulating layer 182 is disposed on the first insulating layer 181. The second insulating layer 182 has a second open portion 182a through which the first open portion 181a of the first insulating layer 181 is exposed, and the second insulating layer 182 does not contact the electrode power supply line 190.

The organic light emitting display apparatus of FIG. 4 will now be described in more detail.

The substrate 110 includes at least one TFT. That is, the TFT may be the first TFT1 disposed in the display area 100 as shown in FIG. 4 or may be a second TFT2 disposed outside the display area 100. Also, the electrode power supply line 190 is disposed outside the display area 100 of the substrate 110.

Structures of elements of an organic light emitting device 200 and others will now be described in more detail.

A buffer layer 120 disposing on the substrate 110 can be formed of $SiO_2$ or the like. Next, a semiconductor layer 130 is formed on the buffer layer 120, and the semiconductor layer 130 may be formed of amorphous silicon, polycrystalline silicon, or an organic semiconductor material. Although not shown, the semiconductor layer 130 may include source and drain areas doped with a dopant, and a channel area.

A gate electrode 150 is formed on the semiconductor layer 130, through which source and/or drain electrodes 170 electrically communicate with each other according to a signal applied to the gate electrode 150. The gate electrode 150 may be formed of a material, such as MoW, Ag, Cu, Al, or the like, in taking consideration of various suitable factors, such as adherence to an adjacent layer, planarizing and machining of a surface of a layer stacked on the gate electrode 150, etc. In the present embodiment, a gate insulating layer 140 is formed of $SiO_2$ and is interposed between the semiconductor layer 130 and the gate electrode 150 in order to secure (or provide) insulation between the semiconductor layer 130 and the gate electrode 150.

An interlayer insulating layer 160 is formed on the gate electrode 150 and may be formed of a material such as silicon oxide, silicon nitride, or the like as a single layer or a multilayer. The source and/or drain electrodes 170 are formed on the interlayer insulating layer 160. The source and/or drain electrodes 170 are respectively and electrically connected to the semiconductor layer 130 through contact holes which are formed in the interlayer insulating layer 160 and the gate insulating layer 140. The source and/or drain electrodes 170 may be formed of a material such as MoW, Ag, Cu, Al, or the like based on a desired conductivity, for example.

The electrode power supply line 190 is disposed outside the display area 100. In FIG. 4, the electrode power supply line 190 is disposed on the interlayer insulating layer 160 on which the source and/or drain electrodes 170 of the first TFT are disposed. Alternatively, the electrode power supply line 190 may be simultaneously (or concurrently) formed together with the source and/or drain electrodes 170 of the first TFT1. However, the present invention is not limited thereto. For example, the electrode power supply line 190 may be formed on a layer on which the gate electrode 150 of the first TFT1 is formed or may be formed independently and separately from the electrodes of the first TFT1. In one embodiment, the electrode power supply line 190 is formed on the interlayer insulating layer 160 on which the source and/or drain electrodes 170 are disposed. The electrode power supply line 190 may be formed of various suitable materials having low resistivity and high conductivity that can supply electrical signals to a counter electrode 230 of the organic light emitting device 200. Hence, the material of the electrode power supply line 190 may be copper, silver, aluminum, or the like. However, the present invention is not thereby limited, and the electrode power supply line may be composed of other suitable materials. The material of the electrode power supply line 190 substantially reacts with an organic material of the second insulating layer 182.

The first insulating layer 181 is formed above the first TFT1 to operate as a passivation layer so as to protect the first TFT1. The first insulating layer 181 may be formed of various suitable materials, e.g., an inorganic material, such as silicon oxide, silicon nitride, or silicon oxynitride that can provide adequate protection to the first TFT1. As shown in FIG. 4, the first insulating layer 181 is formed as a single layer. However, the first insulating layer 181 may be formed as a multilayer. The first insulating layer 181 has the first open portion 181a so as to expose a portion or a whole top surface of the electrode power supply line 190. In FIG. 4, the first insulating layer 181 covers both sides of the electrode power supply line 190.

The second insulating layer 182 is formed as the planarizing layer on the first insulating layer 181. In other words, the second insulating layer 182 has a planarized or substantially planarized top surface and a relatively curved lower portion. The second insulating layer 182 may be formed of an organic material, e.g., acryl, BCB, photoacryl, or the like. The second insulating layer 182 is shown as a single layer in FIG. 4; however, it may be a multilayer. The second insulating layer 182 has the second open portion 182a through which the first open portion 181a of the first insulating layer 181 is exposed. As a result, the second insulating layer 182 does not contact the electrode power supply line 190 as shown in FIG. 4.

The organic light emitting device 200 is disposed on the second insulating layer 182 and includes a pixel electrode 210, a counter electrode 230, and an intermediate layer 220 interposed between the pixel electrode 210 and the counter electrode 230. The organic light emitting device 200 will now be described in more detail.

In the display area 100, openings are formed in the first and second insulating layers 181 and 182 to expose at least one of the source and/or drain electrodes 170 of the first TFT1. The pixel electrode 210 is disposed on the second insulating layer 182 and thus contacts at least one of the source and/or drain electrodes 170 through the openings so as to be electrically connected to the first TFT1. The pixel electrode 210 may be a transparent electrode or a reflective electrode. If the pixel electrode 210 is a transparent electrode, the pixel electrode 210 may be formed of ITO, IZO, ZnO, or $In_2O_3$. If the pixel electrode 210 is a reflective electrode, the pixel electrode 210 may include a reflective layer formed of Ag, Mg, Al, Pt, Pd, Au, Ni, Nd, Ir, Cr, or a combination thereof and a layer formed of ITO, IZO, ZnO, or $In_2O_3$. However, the present invention is not limited thereto, and the pixel electrode 210 may be formed of various suitable materials and have a single layer structure or a multilayer structure.

A third insulating layer 183 is disposed on the second insulating layer 182. The third insulating layer 183 operates as a pixel defining layer, i.e., has an opening corresponding to each sub-pixel, i.e., an opening exposing a central portion or a whole portion of the pixel electrode 210 so as to define pixels. As shown in FIG. 4, the third insulating layer 183 increases a distance between an end of the pixel electrode 210 and the counter electrode 230 so as to prevent (or protect from) an arc, etc. from occurring at the end of the pixel electrode 210. The third insulating layer 183 is disposed on the second insulating layer 182, and may be disposed outside the display area 100 as shown in FIG. 4. The third insulating layer 183 has a third open portion 183a through which the first open portion 181a of the first insulating layer 181 is exposed. As a result, the third insulating layer 183 does not contact the electrode power supply line 190 as shown in FIG. 4. The third insulating layer 183 may be formed of an organic material, such as polyimide, for example.

The intermediate layer 220 of the organic light emitting device 200 may be formed of a low or high molecular weight material. If the intermediate layer 220 is formed of the low molecular material, a hole injection layer (HIL), a hole transport layer (HTL), an emission layer (EML), an electron transport layer (ETL), an electron injection layer (EIL), etc. may be stacked into a single structure or a compound structure to form the intermediate layer 220. Alternatively, the intermediate layer 220 may be formed of an organic material such as copper phthalocyanine (CuPc), N,N'-Di(naphthalene-1-yl)-N,N'-diphenyl-benzidine (NPB), tris-8-hydroxyquinoline aluminum (Alq3), or the like. These layers may be formed using a vacuum deposition method.

If the intermediate layer 220 is formed of the high molecular material, the intermediate layer 220 may have a structure in which an HTL and an EML are stacked. Here, the HTL may be formed of PEDOT, and the EML may be formed of Poly- Phenylenevinylene (PPV)-family and Polyfluorene-family high molecular materials using a screen printing method, an inkjet printing method, or the like. The intermediate layer 220 is not limited thereto, and thus, may have various suitable structures.

The counter electrode 230 may be disposed in the display area 100 to cover the display area 100 as shown in FIG. 4. The counter electrode 230 contacts the electrode power supply line 190 disposed outside the display area 100 to receive an electrical signal from the electrode power supply line 190. The counter electrode 230 may be a transparent or reflective electrode. If the counter electrode 230 is a transparent electrode, the counter electrode 230 may include a layer formed of metal having a low work function, i.e., Li, Ca, LiF/Ca, LiF/Al, Al, Ag, Mg, or a combination of Li, Ca, LiF/Ca, LiF/Al, Al, Ag, and Mg, and a transparent conductive layer formed of ITO, IZO, ZnO, or $In_2O_3$. If the counter electrode 230 is a reflective electrode, the counter electrode 230 may be formed of Li, Ca, LiF/Ca, LiF/Al, Al, Ag, Mg, or a combination of Li, Ca, LiF/Ca, LiF/Al, Al, Ag, and Mg. However, the counter electrode 230 is not limited to these structures and materials, and thus, may be modified into various suitable forms.

Figure 5A:
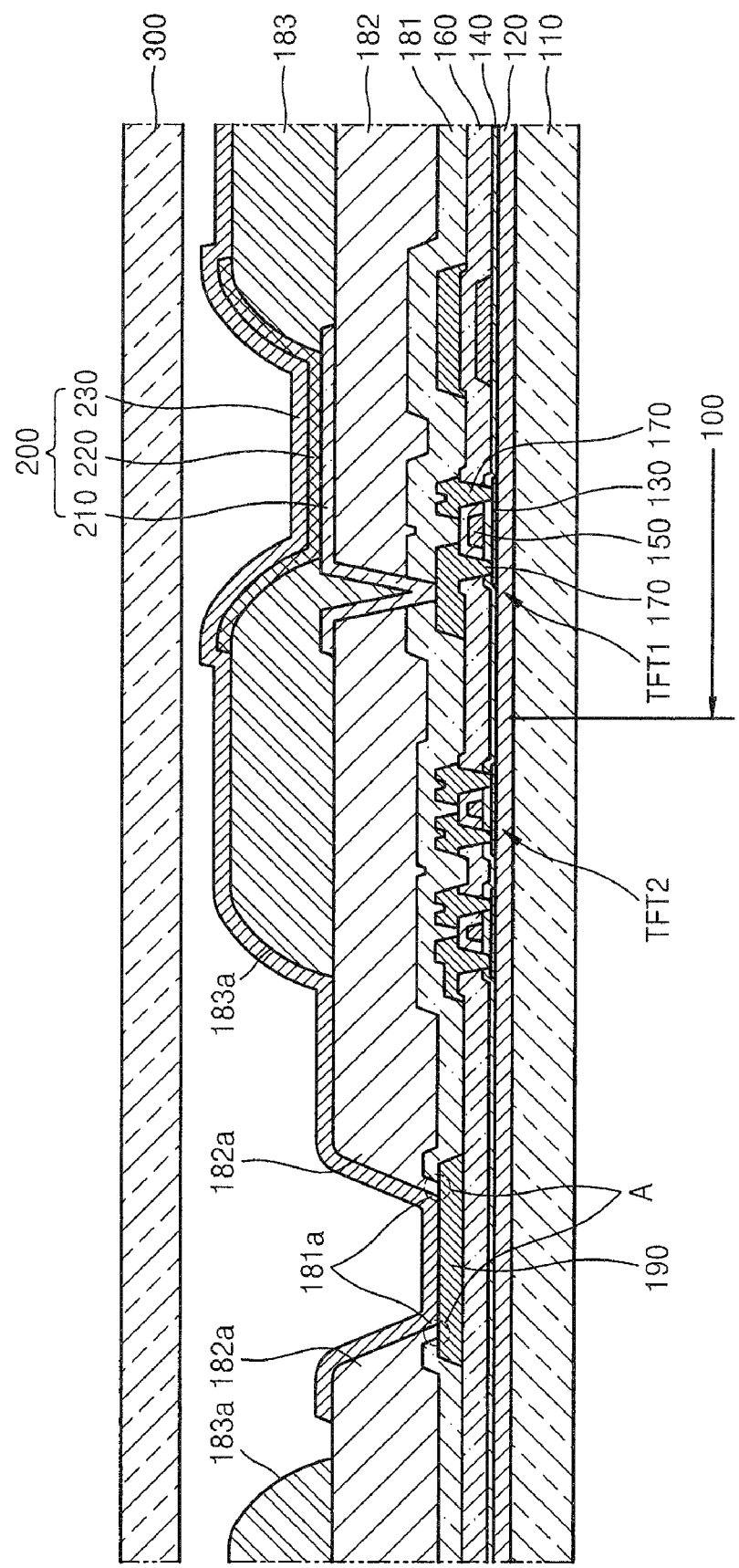
FIG. 5A is schematic cross-sectional views of an organic light emitting display apparatus according to another comparative example.
Figure 5B:
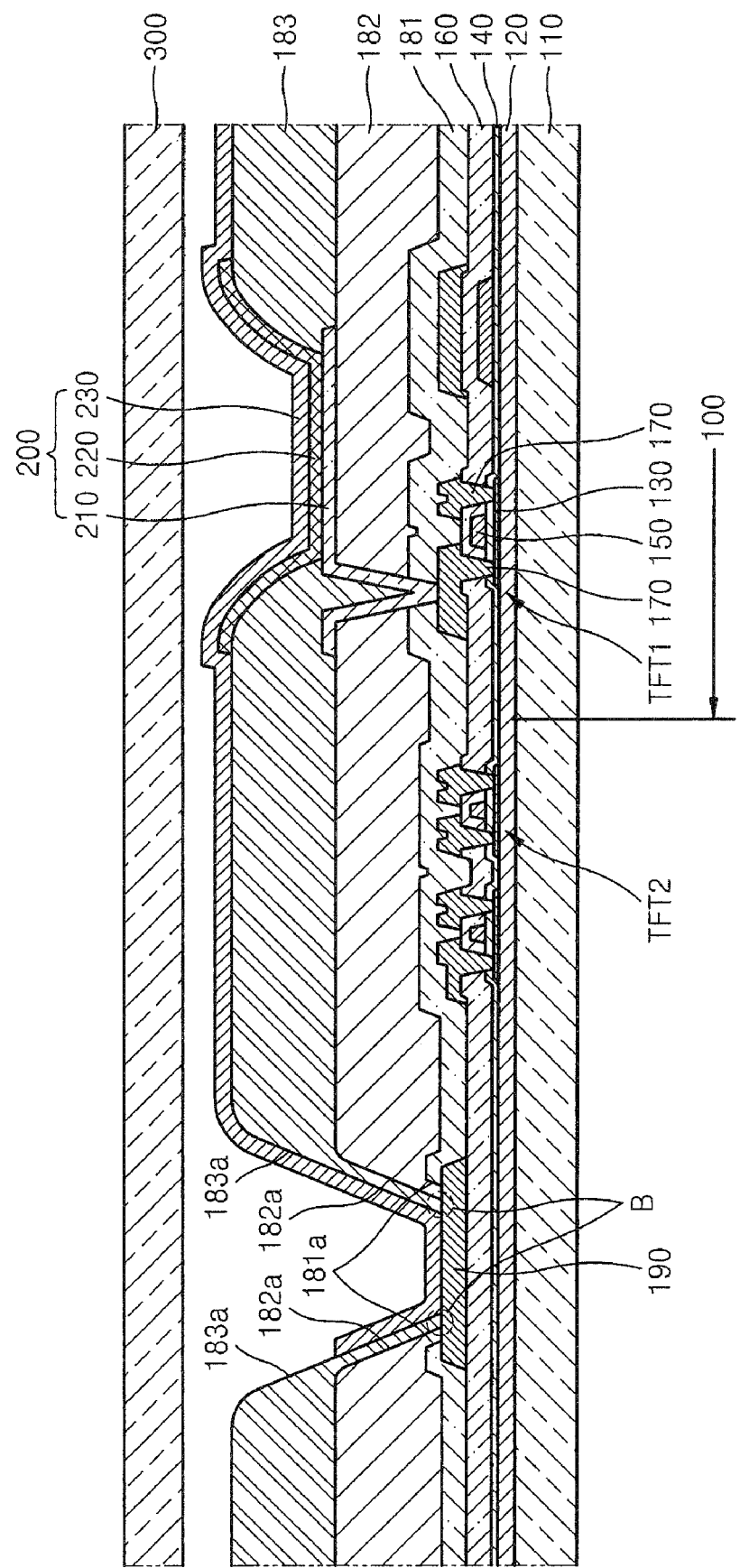
FIG. 5B is schematic cross-sectional views of an organic light emitting display apparatus according to another comparative example.

In an organic light emitting display apparatus shown in FIG. 5A, portion A of a second insulating layer 182, formed of an organic material, contacts an electrode power supply line 190. In a organic light emitting display apparatus shown in FIG. 5B, a second insulating layer 182, formed of an organic material, and portion B of a third insulating layer 183, formed of an organic material, both contact an electrode power supply line 190. Thus, the electrode power supply line 190 may react with one or more organic components of the second and/or third insulating layer 182 or 183 and thus be damaged. As a result, IR drop may occur and/or electrical signals may not be transmitted (or be transmitted improperly) due to an increase in resistance in the electrode power supply line 190.

However, in the case of the organic light emitting display apparatus of the present embodiment shown in FIG. 4, the first insulating layer 181 has the first open portion 181a through which the portion or the whole top surface of the electrode power supply line 190 is exposed. Also, the second insulating layer 182 has the second open portion 182a through which the first open portion 181a of the first insulating layer 181, when the second insulating layer 182 is disposed on the first insulating layer 181, is exposed. As a result, the second insulating layer 182 does not contact the electrode power supply line 190 to cause damage to the electrode power supply line 190. In addition, the third insulating layer 183 has the third open portion 183a through which the first open portion 181a of the first insulating layer 181 is exposed, so as to not contact the electrode power supply line 190. In other words, the first insulating layer 181 is formed as the passivation layer of an inorganic material having a low reaction with the electrode power supply line 190 and prevents (or protects) the second and third insulating layers 182 and 183 from contacting the electrode power supply line 190. Thus, in the organic light emitting display apparatus of the present embodiment, the electrode power supply line 190 can be prevented (or protected) from reacting with the organic material(s) of the second and third insulating layers 182 and 183, so as to not be damaged, and thus, not require a great change in the manufacturing process of the organic light emitting display apparatus.

Figure 6:
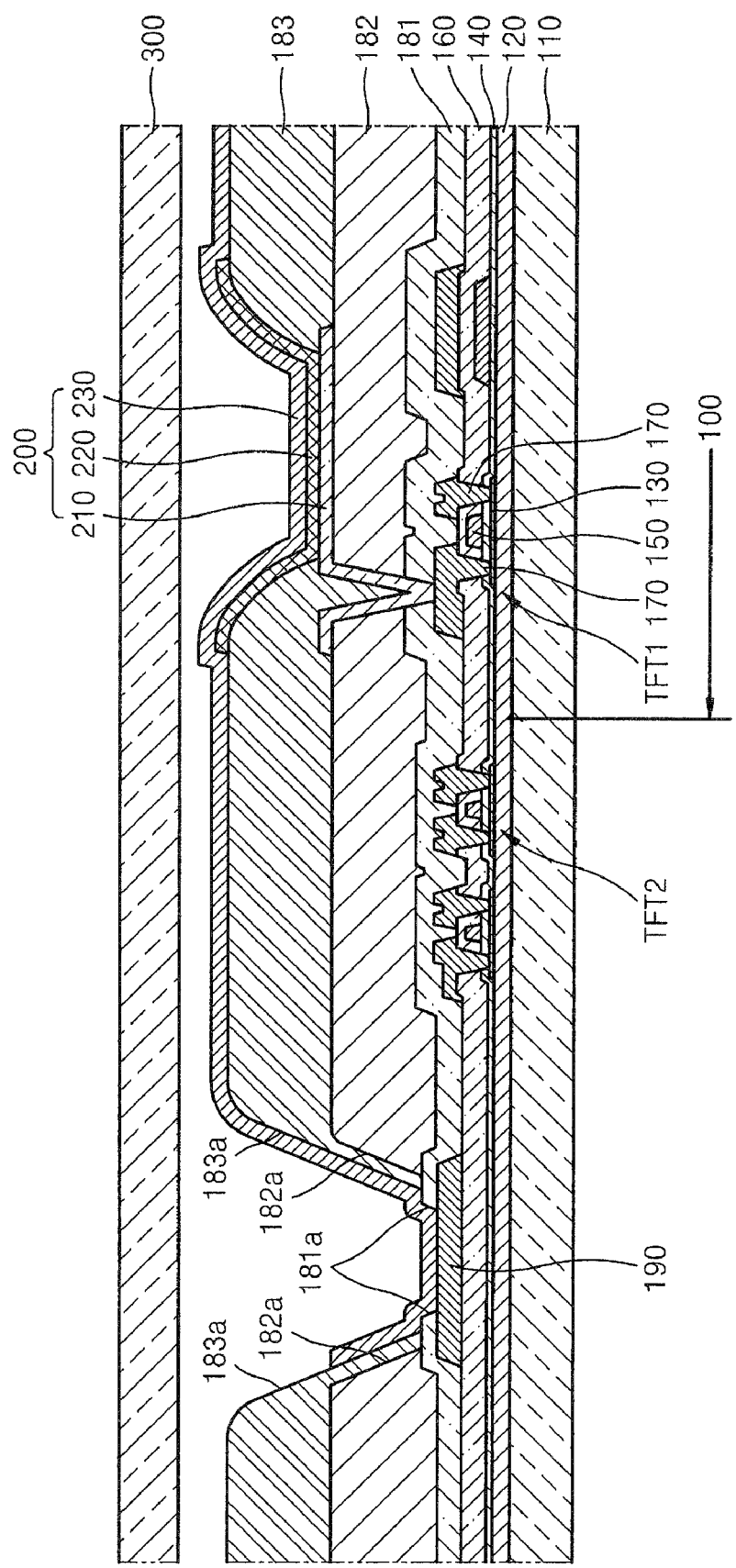
FIG. 6 is a schematic cross-sectional view of a portion of an organic light emitting display apparatus according to another embodiment of the present invention.

FIG. 6 is a schematic cross-sectional view of a portion of an organic light emitting display apparatus according to another embodiment of the present invention. Referring to FIG. 6, the organic light emitting display apparatus of the present embodiment is different from that of FIG. 4 in terms of a correlation between second and third insulating layers 182 and 183.

In the case of the organic light emitting display apparatus of FIG. 4, the third open portion 183a of the third insulating layer 183 exposes the second open portion 182a of the second insulating layer 182. However, in the case of the organic light emitting display apparatus of the present embodiment, a second open portion 182a of the second insulating layer 182 is covered with the third insulating layer 183. In this case also, a third open portion 183a of the third insulating layer 183 is disposed to expose a first open portion 181a of a first insulating layer 181. Thus, the second and third insulating layers 182 and 183 do not contact an electrode power supply line 190. In other words, the first insulating layer 181 is formed as a passivation layer of an inorganic material having low reaction with the electrode power supply line 190 so as to prevent (or protect) the second and third insulating layers 182 and 183 from contacting the electrode power supply line 190. Thus, in the organic light emitting display apparatus of the present embodiment, the electrode power supply line 190 can be effectively prevented from reacting with the organic materials of the second and third insulating layers 182 and 183, so as to not be damaged, and thus, not require a great change in the manufacturing process of the organic light emitting display apparatus.

Figure 7:
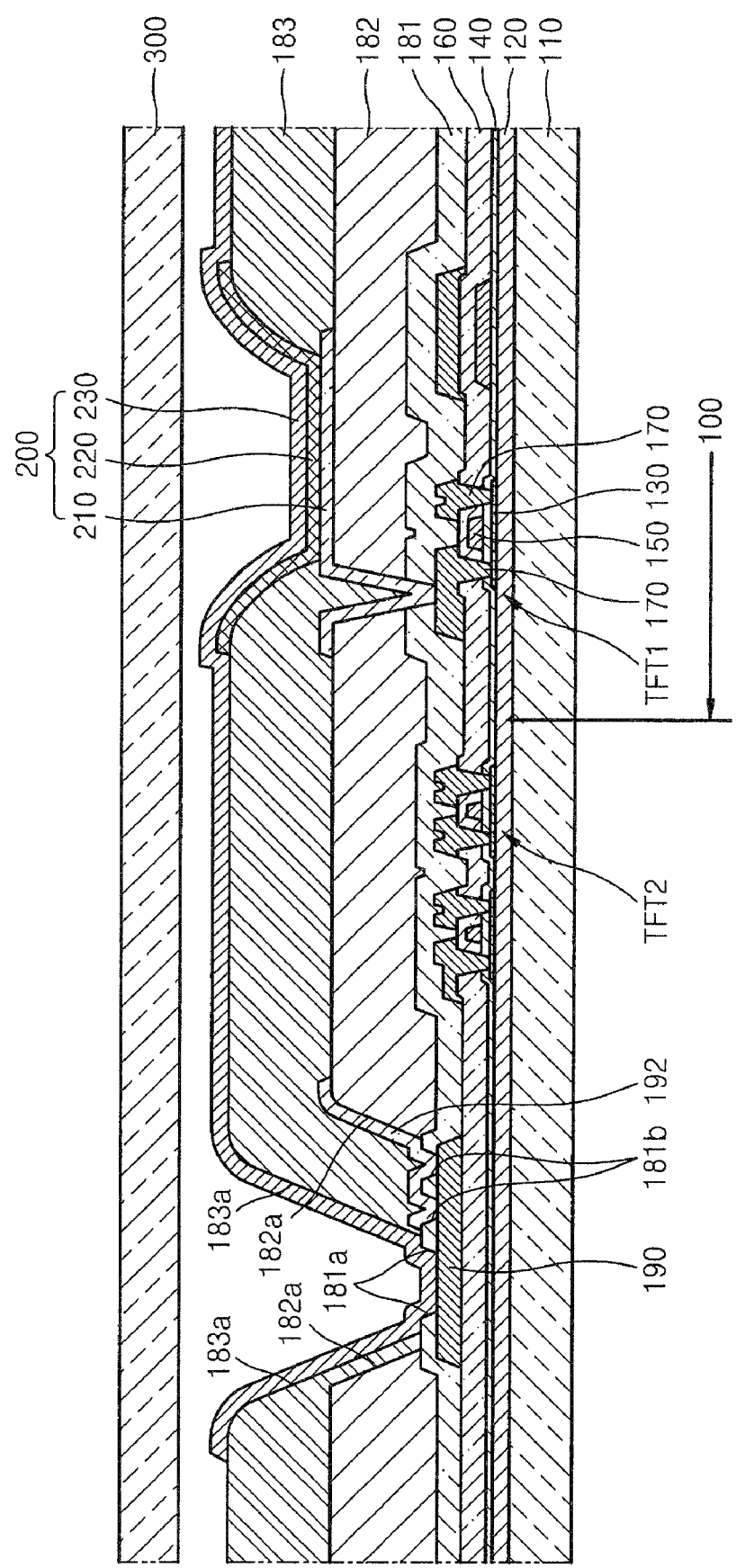
FIG. 7 is a schematic cross-sectional view of a portion of an organic light emitting display apparatus according to another embodiment of the present invention.

FIG. 7 is a schematic cross-sectional view of a portion of an organic light emitting display apparatus according to another embodiment of the present invention. The organic light emitting display apparatus of the present embodiment is different from that of FIG. 6 in terms of a structure of a first insulating layer 181, a position relationship between the first insulating layer 181 and a third insulating layer 183, and an addition of an auxiliary conductive layer 192.

As shown in FIG. 7, in the case of the organic light emitting display apparatus of the present embodiment, the first insulating layer 181 includes multiple first open portions 181a and 181b. A second insulating layer 182 has a second open portion 182a through which the open portions 181a and 181b of the first insulating layer 181, as in the organic light emitting display apparatus of FIG. 6, are exposed. The third insulating layer 183 is a pixel defining layer and has a third open portion 183a, and the third insulating layer 183 covers the first open portions 181b of the first insulating layer 181, but it exposes the first open portion 181a of the first insulating layer 181. In other words, the third insulating layer 183 is disposed to cover portions of an electrode power supply line 190 that is exposed through the first open portions 181b of the first insulating layer 181. In the present embodiment, the auxiliary conductive layer 192 is interposed between the electrode power supply line 190 and the third insulating layer 183. In other words, the auxiliary conductive layer 192 is interposed between the electrode supply line 190 exposed through the first open portions 181b of the first insulating layer 181 and the third insulating layer 183, so that the third insulating layer 183 does not contact the electrode power supply line 190. According to the structure of the present embodiment, the electrode power supply line 190 does not contact the second and third insulating layers 182 and 183 that may be formed of organic materials. As a result, the electrode power supply line 190 can be prevented (or protected) from reacting with the organic materials of the second and third insulating layers 182 and 183, so as to not be damaged.

The auxiliary conductive layer 192 contacts portions of the electrode power supply line 190 exposed through the first open portion 181b of the first insulating layer 181 so as to prevent (or reduce) IR drop from occurring due to a resistance in the electrode power supply line 190. The auxiliary conductive layer 192 may be simultaneously (or concurrently) formed when a pixel electrode 210 of an organic light emitting device 200 is formed in a display area 100, wherein the auxiliary conductive layer 192 may be formed of the same (or substantially the same) material as that of which the pixel electrode 210 is formed. Thus, the above-described effects can be obtained without a great change in the manufacturing process of the organic light emitting display apparatus.

Figure 8:
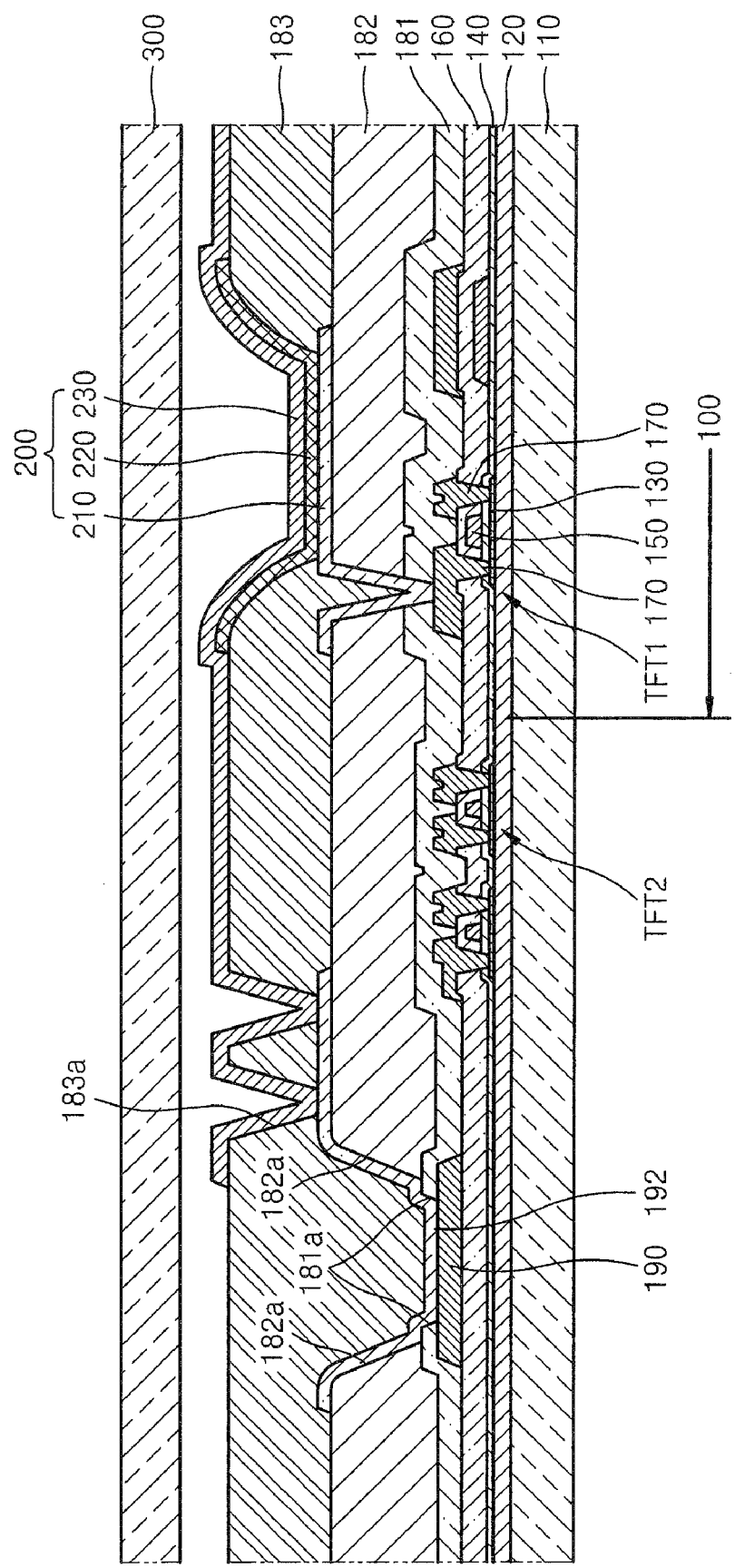
FIG. 8 is a schematic cross-sectional view of a portion of an organic light emitting display apparatus according to another embodiment of the present invention.

FIG. 8 is a schematic cross-sectional view of a portion of an organic light emitting display apparatus according to another exemplary embodiment of the present invention.

The organic light emitting display apparatus of the exemplary embodiment is different from that of FIG. 6 in terms of structural arrangement between first and third insulating layers 181 and 183. In addition, there is an auxiliary conductive layer 192.

As in the organic light emitting display apparatus of FIG. 6, in the organic light emitting display apparatus of the present embodiment, a second insulating layer 182 has a second open portion 182*a* through which a first open portion 181*a* of the first insulating layer 181 is exposed. However, in the organic light emitting display apparatus of the present embodiment, the third insulating layer 183 is a pixel defining layer and disposed to cover an electrode power supply line 190 exposed through the first insulating layer 181. However, the auxiliary conductive layer 192 is interposed between the electrode power supply line 190 and the third insulating layer 183, so that the third insulating layer 183 does not contact the electrode power supply line 190. In other words, the auxiliary conductive layer 192 is interposed between the electrode power supply line 190 exposed through the first and second insulating layers 181 and 182 and the third insulating layer 183, so that the third insulating layer 183 does not contact the electrode power supply line 190. In the case of the organic light emitting display apparatus having the above-described structure, the electrode power supply line 190 does not contact the second and third insulating layers 182 and 183 that may be formed of organic materials. Thus, the electrode power supply line 190 can be prevented (or protected) from reacting with the organic materials of the second and third insulating layers 182 and 183, so as to not be damaged.

The auxiliary conductive layer 192 contacts a portion of the electrode power supply line 190 exposed through the first and second insulating layers 181 and 182 so as to prevent IR drop from occurring due to a resistance in the electrode power supply line 190. The auxiliary conductive layer 192 may be simultaneously (or currently) formed when a pixel electrode 210 of an organic light emitting device 200 is formed in a display area 100, wherein the auxiliary conductive layer 192 may be formed of the same (or substantially the same) material as that of which the pixel electrode 210 is formed. Thus, the above-described effects can be obtained without a great change in the manufacturing process of the organic light emitting display apparatus. The third insulating layer 183 has a third open portion 183*a* through which a portion of the auxiliary conductive layer 192 is exposed. Thus, a counter electrode 230 is electrically connected to the auxiliary conductive layer 192 through the third open portion 183*a*. As a result, the counter electrode 230 is electrically connected to the electrode power supply line 190 through the auxiliary conductive layer 192 to receive an electrical signal from the electrode power supply line 190.

Figure 9:
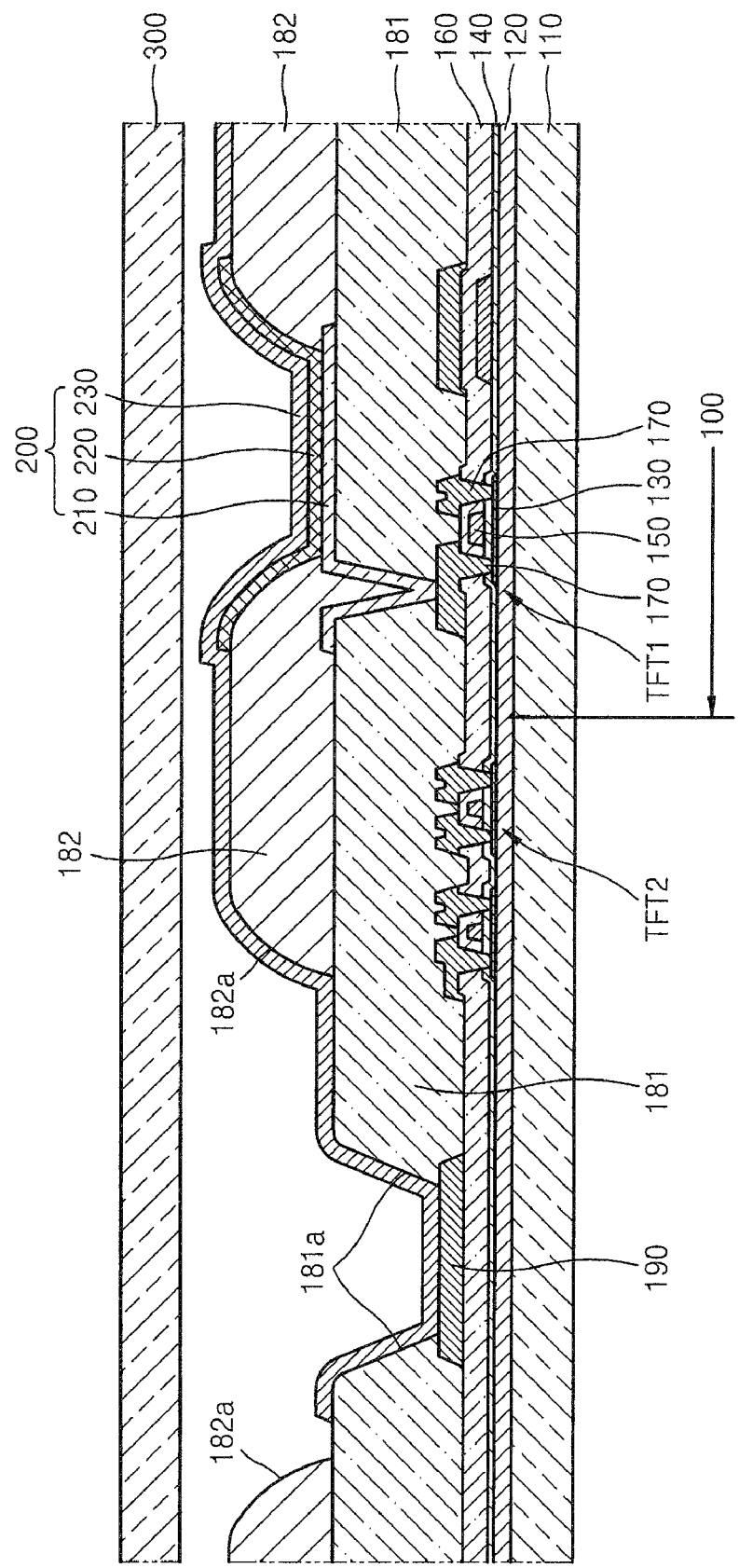
FIG. 9 is a schematic cross-sectional view of a portion of an organic light emitting display apparatus according to another embodiment of the present invention.

FIG. 9 is a schematic cross-sectional view of a portion of an organic light emitting display apparatus according to another embodiment of the present invention.

The organic light emitting display apparatus of the present embodiment is different from that of FIG. 4 in terms of insulating layers. In other words, in the case of the organic light emitting display apparatus of the present embodiment, a first insulating layer 181 operates as a passivation layer which protects a first TFT1 and as a planar layer of which the top surface is largely planar, although elements such as TFT are disposed under the first insulating layer 181. The first insulating layer 181 has an first open portion 181*a* through which a portion or a whole top surface of an electrode power supply line 190 is exposed. The first insulating layer 181 is formed of an insulating inorganic material, such as silicon oxide, silicon nitride, silicon oxynitride, or the like, so that the electrode power supply line 190 is not damaged when in contact with the first insulating layer 181. In the case of the organic light emitting display apparatus of the present embodiment, a second insulating layer 182 operates as a pixel defining layer. In this case, the second insulating layer 182 may be formed of an organic material, such as polyimide for example. The second insulating layer 182 has a second open portion 182*a* that expose the first open portion 181*a* of the first insulating layer 181 and thus does not contact the electrode power supply line 190. A counter electrode 230 of an organic light emitting device 200 contacts the electrode power supply line 190 exposed through the first open portion 181*a* of the first insulating layer 181 and the second open portion 182*a* of the second insulating layer 182, so as to receive one or more electrical signals from the electrode power supply line 190.

Even if the first insulating layer 181 operates as the passivation layer and the planar layer, and the second insulating layer 182 operates as the pixel defining layer, the second insulating layer 182 may be formed of an organic material and still does not contact the electrode power supply line 190. Thus, the electrode power supply line 190 can be prevented (or protected) from reacting with the organic material of the second insulating layer 182, so as to not be damaged.

Figure 10:
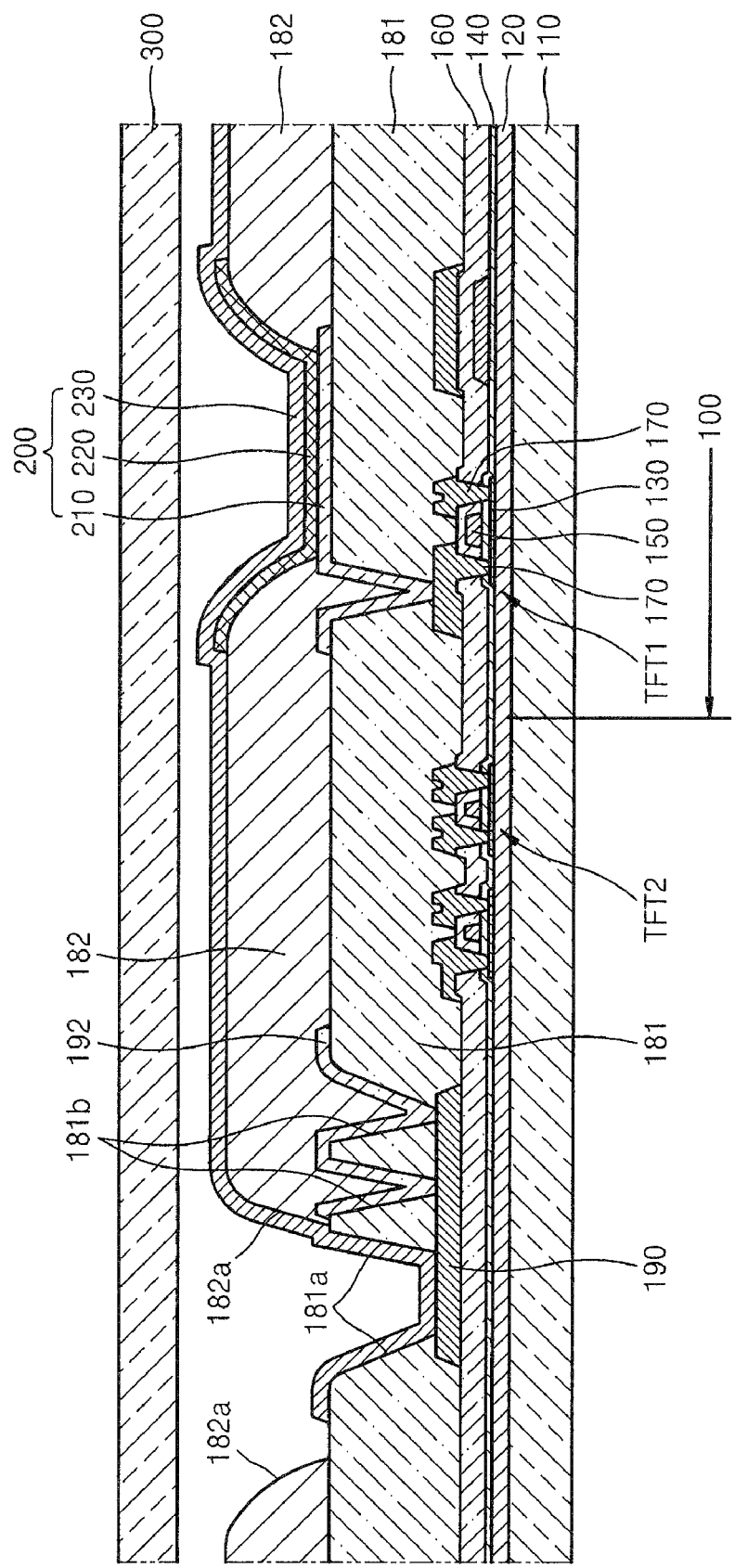
FIG. 10 is a schematic cross-sectional view of a portion of an organic light emitting display apparatus according to another embodiment of the present invention.

FIG. 10 is a schematic cross-sectional view of a portion of an organic light emitting display apparatus according to another embodiment of the present invention.

The organic light emitting display apparatus of the present embodiment is different from that of FIG. 7 in terms of insulating layers. In other words, in the case of the organic light emitting display apparatus of the present embodiment, a first insulating layer 181 operates as a passivation layer which protects a first TFT and as a planar layer, which has a planar or a substantially planar surface even though there are elements, such as TFT, that are disposed under the first insulating layer 181. The first insulating layer 181 has a plurality of first open portions 181*a* and 181*b* which expose a portion or a whole top surface of an electrode power supply line 190. The first insulating layer 181 is formed of an insulating inorganic material such as silicon oxide, silicon nitride, silicon oxynitride, or the like, so that the electrode power supply line 190 is not damaged when in contact with the first insulating layer 181. In the case of the organic light emitting display apparatus of the present embodiment, a second insulating layer 182 operates as a pixel defining layer. In this case, the second insulating layer 182 may be formed of an organic material, such as polyimide, for example. The second insulating layer 182 is disposed to cover a portion of the electrode power supply line 190 exposed through the first open portions 181*b* of the first insulating layer 181. Here, an auxiliary conductive layer 192 is interposed between the electrode power supply line 190, exposed through the first open portions 181*b* of the first insulating layer 181, and the second insulating layer 182, so that the second insulating layer 182 does not contact the electrode power supply line 190. A counter electrode 230 contacts a portion of the electrode power supply line 190 exposed through the first open portions 181*a* of the first insulating layer 181 and a second open portions 182*a* of the second insulating layer 182 so as to receive electrical signals from the electrode power supply line 190.

Even if the first insulating layer 181 operates as the passivation layer and the planar layer, and the second insulating layer 182 is the pixel defining layer, the second insulating layer 182 may be formed of an organic material and does not contact the electrode power supply line 190. Thus, the electrode power supply line 190 can be prevented (or protected) from reacting with the organic material of the second insulating layer 182, so as to not be damaged.

In the above-described structure, the auxiliary conductive layer 192 contacts the portion of the electrode power supply line 190 exposed through the first open portion 181*b* of the first insulating layer 181 so as to prevent (or reduce) IR drop from occurring due to a resistance in the electrode power supply line 190. The auxiliary conductive layer 192 may be simultaneously (or concurrently) formed when a pixel electrode 210 is formed in a display area 100, wherein the auxiliary conductive layer 192 is formed of the same (or substantially the same) material as that of which the pixel electrode 210 is formed. Thus, the above-described effects can be obtained without a great change in the manufacturing process of the organic light emitting display apparatus.

As described in the present embodiment of FIG. 10, the first insulating layer 181 operates as the passivation layer that protects the first TFT1 and as the planar layer, which has a planar or a substantially planar surface even though there are elements such as TFT disposed under the first insulating layer 181. However, the present invention may also be applied to a case where the top surface of the first insulating layer 181 is not planar.

Figure 11:
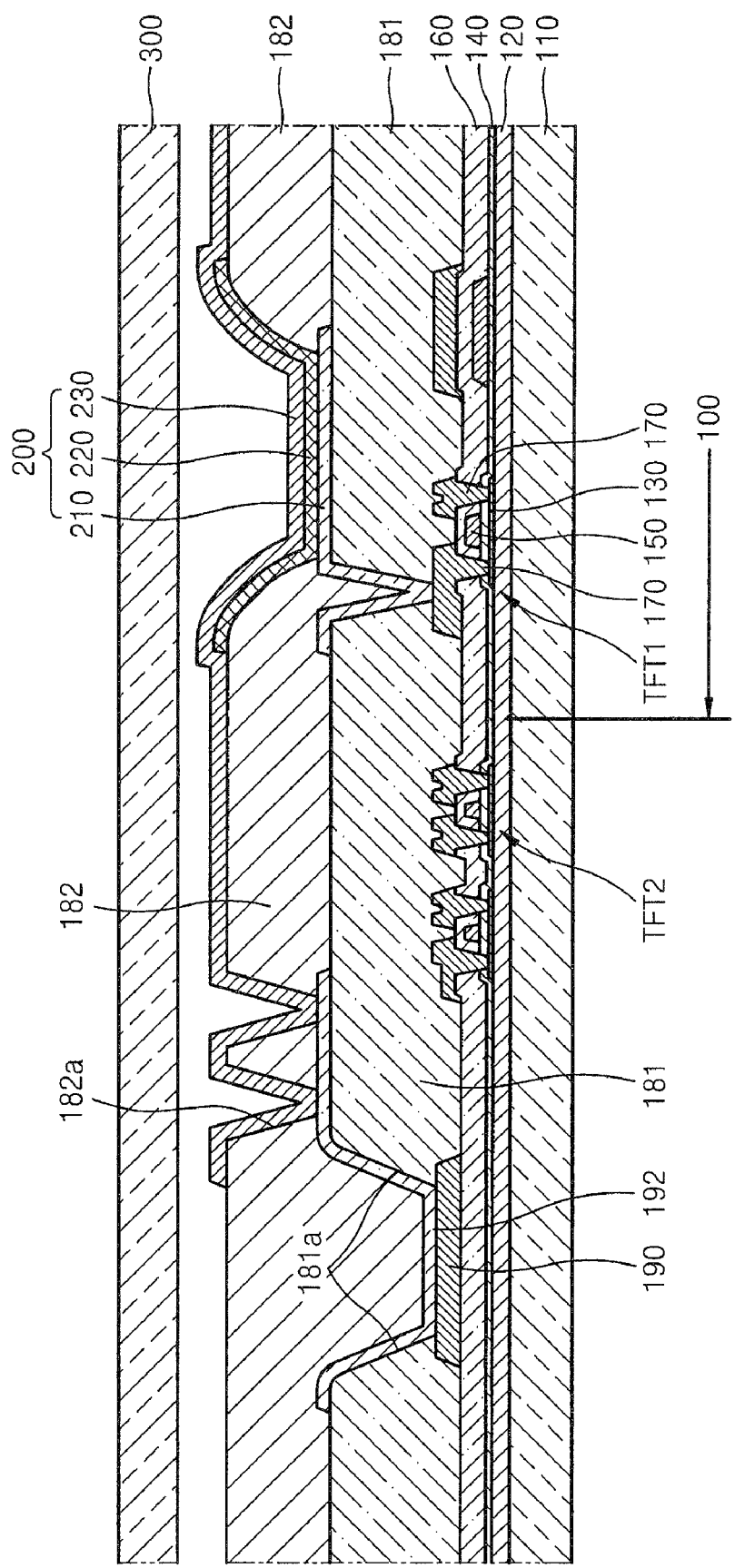
FIG. 11 is a schematic cross-sectional view of a portion of an organic light emitting display apparatus according to another embodiment of the present invention.

FIG. 11 is a schematic cross-sectional view of a portion of an organic light emitting display apparatus according to another embodiment of the present invention.

The organic light emitting display apparatus of the present embodiment is different from that of FIG. 8 in terms of the insulating layers. In other words, in the case of the organic light emitting display apparatus of the present embodiment, a first insulating layer 181 operates as a passivation layer which protects a first TFT1 and as a planar layer, which has a planar or a substantially planar top surface even though there are elements such as TFT disposed under the first insulating layer 181. The first insulating layer 181 has a first open portion 181*a* through which a portion or a whole top surface of an electrode power supply line 190 is exposed. The first insulating layer 181 is also formed of an insulating inorganic material such as silicon oxide, silicon nitride, silicon oxynitride, or the like, so that the electrode power supply line 190 is not damaged when in contact with the first insulating layer 181. In the case of the organic light emitting display apparatus of the present embodiment, a second insulating layer 182 operates as a pixel defining layer. In this case, the second insulating layer 182 may be formed of an organic material, such as polyimide, for example. The second insulating layer 182 is disposed to cover the electrode power supply line 190 exposed through the first insulating layer 181. However, an auxiliary conductive layer 192 is interposed between the electrode power supply line 190 and the second insulating layer 182. In other words, the auxiliary conductive layer 192 is interposed between the electrode power supply line 190 exposed through the first insulating layer 181 and the second insulating layer 182, so that the second insulating layer 182 does not contact the electrode power supply line 190. In the case of the organic light emitting display apparatus of the present embodiment having the above-described structure, the electrode power supply line 190 does not contact the second insulating layer 182 that may be formed of an organic material. The electrode power supply line 190 can be prevented (or protected) from reacting with the organic material of the second insulating layer 182, so as to not be damaged.

The auxiliary conductive layer 192 contacts a portion of the electrode power supply line 190 exposed through the first insulating layer 181 so as to prevent (or reduce) IR drop from occurring due to a resistance in the electrode power supply line 190. The auxiliary conductive layer 192 may be simultaneously (or concurrently) formed when a pixel electrode 210 of an organic light emitting device 200 is formed in a display area 100, wherein the auxiliary conductive layer 192 may be formed of the same (or substantially the same) material as that of which the pixel electrode 210 is formed. Thus, the above-described effects can be obtained without a great change in the manufacturing process of the organic light emitting display apparatus. The second insulating layer 182 has a second open portion 182*a* through which a portion of the auxiliary conductive layer 192 is exposed. Thus, a counter electrode 230 of the organic light emitting device 200 can be electrically connected to the auxiliary conductive layer 192 through the second open portion 182*a* of the second insulating layer 182. As a result, the counter electrode 230 is electrically connected to the electrode power supply line 190 through the auxiliary conductive layer 192 so as to receive one or more electrical signals from the electrode power supply line 190.

As has been described in the present embodiment of FIG. 11, the first insulating layer 181 operates as the passivation layer which protects the first TFT1 and as the planar layer, which has a planar or substantially planar top surface, even though there are elements such as TFT disposed under the first insulating layer 181. However, the present invention may be applied to a case where the top surface of the first insulating layer 181 is not planar.

According to various exemplary embodiments, there is provided, an organic light emitting display apparatus that is capable of preventing (or reducing) damage to an electrode power supply line and at the same time can be easily manufactured.

While the present invention has been described with reference to exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An organic light emitting display apparatus comprising:
   a substrate comprising a display area;
   a thin film transistor (TFT) in the display area;
   an electrode power supply line outside the display area;
   a first insulating layer covering the TFT and having a first open portion through which at least a portion of the electrode power supply line is exposed;
   a second insulating layer on the first insulating layer and having a second open portion through which the first open portion and a top surface of the first insulating layer are exposed so that the second insulating layer does not contact the electrode power supply line; and
   a pixel electrode in the display area and on the second insulating layer, the pixel electrode being electrically connected to the TFT
   wherein the first insulating layer and the second insulating layer are on the same side of the pixel electrode.

2. The organic light emitting display apparatus of claim 1, wherein the first insulating layer is a passivation layer.

3. The organic light emitting display apparatus of claim 1, wherein the second insulating layer is a planar layer having a substantially planar top surface, and is disposed over the TFT.

4. The organic light emitting display apparatus of claim 1, wherein the second insulating layer comprises an organic material.

5. The organic light emitting display apparatus of claim 1, wherein the second insulating layer comprises a material selected from the group consisting of acryl, BCB (benzocyclobutene), photoacryl, and combinations thereof.

6. The organic light emitting display apparatus of claim 1, wherein the first insulating layer comprises an inorganic material.

7. The organic light emitting display apparatus of claim 6, wherein the first insulating layer comprises a material selected from the group consisting of silicon nitride, silicon oxide, silicon oxynitride, and combinations thereof.

8. The organic light emitting display apparatus of claim 1, wherein the electrode power supply line comprises a material that substantially reacts with an organic material.

9. The organic light emitting display apparatus of claim 1, wherein the electrode power supply line comprises a material selected from the group consisting of copper, silver, aluminum, and combinations thereof.

10. The organic light emitting display apparatus of claim 1, wherein the TFT comprises a source electrode, a drain electrode, and a gate electrode, wherein the electrode power supply line is formed of the same material as that of which at least one of the source electrode, the drain electrode, or the gate electrode is formed, wherein the electrode power supply line is formed on the same layer on which the at least one of the source electrode, the drain electrode, or the gate electrode is formed.

11. The organic light emitting display apparatus of claim 1, further comprising a counter electrode contacting the electrode power supply line and disposed above the display area.

12. An organic light emitting display apparatus comprising:
   a substrate comprising a display area;
   a thin film transistor (TFT) in the display area;
   an electrode power supply line outside the display area
   a first insulating layer covering the TFT and having a first open portion through which at least a portion of the electrode power supply line is exposed;
   a second insulating layer on the first insulating layer and having a second open portion through which the first open portion and a top surface of the first insulating layer are exposed so that the second insulating layer does not contact the electrode power supply line;
   a pixel electrode in the display area and on the second insulating layer, the pixel electrode being electrically connected to the TFT; and
   a third insulating layer on the second insulating layer, the third insulating layer having a third open portion through which the first open portion of the first insulating layer is exposed, so that the third insulating layer does not contact the electrode power supply line, and through which a portion or a whole top surface of the pixel electrode is exposed.

13. The organic light emitting display apparatus of claim 12, wherein the third insulating layer comprises an organic material.

14. The organic light emitting display apparatus of claim 12, wherein the third insulating layer comprises polyimide.

15. An organic light emitting display apparatus comprising:
   a substrate comprising a display area;
   a thin film transistor (TFT) in the display area;
   an electrode power supply line outside the display area;
   a first insulating layer covering the TFT and having a plurality of first open portions through which at least a portion of the electrode power supply line is exposed;
   a second insulating layer on the first insulating layer and having a second open portion through which at least one of the first open portions and a top surface of the first insulating layer are exposed so that the second insulating layer does not contact the electrode power supply line; and
   a pixel electrode in the display area and on the second insulating layer, the pixel electrode being electrically connected to the TFT,
   wherein the organic light emitting display apparatus further comprises:
      a third insulating layer disposed to cover the electrode power supply line exposed through the at least one of the first open portions of the first insulating layer, the third insulating layer having a third open portion through which at least a portion of the pixel electrode is exposed; and
      an auxiliary conductive layer between the electrode power supply line, exposed through the at least one of the first open portions of the first insulating layer, and the third insulating layer, so that the third insulating layer does not contact the electrode power supply line.

16. The organic light emitting display apparatus of claim 15, wherein the auxiliary conductive layer comprises the same material as that of which the pixel electrode is formed.

17. An organic light emitting display apparatus comprising:
   a substrate comprising a display area;
   a thin film transistor (TFT) in the display area;
   an electrode power supply line outside the display area;
   a first insulating layer covering the TFT and having a first open portion through which at least a portion of the electrode power supply line is exposed;
   a second insulating layer on the first insulating layer and having a second open portion through which the first open portion and a top surface of the first insulating layer are exposed so that the second insulating layer does not contact the electrode power supply line;
   a pixel electrode in the display area and on the second insulating layer, the pixel electrode being electrically connected to the TFT;
   a third insulating layer covering the electrode power supply line exposed through the first insulating layer, the third insulating layer having a third open portion through which at least a portion of the pixel electrode is exposed; and
   an auxiliary conductive layer between the electrode power supply line, exposed through the first insulating layer, and the third insulating layer, so that the third insulating layer does not contact the electrode power supply line.

18. The organic light emitting display apparatus of claim 17, wherein the auxiliary conductive layer comprises the same material as the pixel electrode.

19. An organic light emitting display apparatus comprising:
   a substrate comprising a display area;
   a thin film transistor (TFT) in the display area;
   an electrode power supply line outside the display area;
   a first insulating layer covering the TFT and having a plurality of first open portions through which at least a portion of the electrode power supply line is exposed;
   a pixel electrode in the display area and on the first insulating layer, the pixel electrode being electrically connected to the TFT;

a second insulating layer covering the electrode power supply line exposed through at least one of the first open portions of the first insulating layer, the second insulating layer having a plurality of second open portions through which at least a portion of the pixel electrode and a portion of the electrode power supply line are exposed; and an auxiliary conductive layer outside the display area and between the electrode power supply line, exposed through the at least one of the first open portions of the first insulating layer, and the second insulating layer, so that the second insulating layer does not contact the electrode power supply line.

20. The organic light emitting display apparatus of claim 19, wherein the auxiliary conductive layer is formed of the same material as that of which the pixel electrode is formed.

21. An organic light emitting display apparatus comprising:

a substrate comprising a display area;
a thin film transistor (TFT) in the display area;
an electrode power supply line outside the display area;
a first insulating layer covering the TFT and having a first open portion through which at least a portion of the electrode power supply line is exposed;
a pixel electrode in the display area of the substrate and on the first insulating layer, the pixel electrode being electrically connected to the TFT;
a third insulating layer covering the electrode power supply line exposed through the first insulating layer, the third insulating layer having a plurality of third open portions through which at least a portion of the pixel electrode and a portion of the electrode power supply line are exposed; and
an auxiliary conductive layer outside the display area and between the electrode power supply line, exposed through the first insulating layer, and the third insulating layer, so that the third insulating layer does not contact the electrode power supply line.

22. The organic light emitting display apparatus of claim 21, wherein the auxiliary conductive layer is formed of the same material as that of which the pixel electrode is formed.

* * * * *

UNITED STATES PATENT AND TRADEMARK OFFICE
CERTIFICATE OF CORRECTION

| | |
|---|---|
| PATENT NO. | : 8,022,618 B2 |
| APPLICATION NO. | : 12/200791 |
| DATED | : September 20, 2011 |
| INVENTOR(S) | : Gyoo-Chul Jo et al. |

It is certified that error appears in the above-identified patent and that said Letters Patent is hereby corrected as shown below:

In the Claims

Column 15, Claim 12, line 41.    Delete "area"

Insert -- area; --

Signed and Sealed this
Twenty-eighth Day of August, 2012

David J. Kappos
*Director of the United States Patent and Trademark Office*